(12) United States Patent
Kim et al.

(10) Patent No.: US 6,882,108 B2
(45) Date of Patent: Apr. 19, 2005

(54) PLASMA DISPLAY DEVICE WITH REDUCED NOISE EXITING THROUGH HEAT RADIATION VENTILATION OPENINGS

(75) Inventors: Ki-Jung Kim, Gongju (KR); Hye-Kyong Kwon, Cheonan (KR); Dae-Young Hong, Pyungtaek (KR); Tae-Kyoung Kang, Ahsan (KR)

(73) Assignee: Samsung SDI Co., Ltd., Suwon (KR)

( * ) Notice: Subject to any disclaimer, the term of this patent is extended or adjusted under 35 U.S.C. 154(b) by 74 days.

(21) Appl. No.: 10/402,373

(22) Filed: Mar. 27, 2003

(65) Prior Publication Data
US 2004/0027069 A1 Feb. 12, 2004

(30) Foreign Application Priority Data
Mar. 27, 2002 (KR) ................. 10-2002-0016813

(51) Int. Cl.[7] ............................................. H01J 17/49
(52) U.S. Cl. ................. 313/582; 313/46; 313/634; 361/688; 361/816; 361/831
(58) Field of Search ............. 313/582, 46, 590, 313/634, 238; 315/169.4; 362/294; 361/681, 688, 800, 816, 831

(56) References Cited

U.S. PATENT DOCUMENTS 5,574,625 A * 11/1996 Ohgami et al. ............. 361/684
5,971,566 A * 10/1999 Tani et al. .................. 362/294
6,310,767 B1 * 10/2001 Spear et al. ................. 361/681
6,494,429 B1 * 12/2002 Tajima ........................ 248/473
6,560,124 B1 * 5/2003 Irie et al. .................... 361/816

FOREIGN PATENT DOCUMENTS

KR       2000-0033625           6/2000

OTHER PUBLICATIONS

Korean Patent Abstract, Publication No., 2000-0033625, published on Jun. 15, 2000, in the name of Yeo Uk Cho.

* cited by examiner

Primary Examiner—Joseph Williams
Assistant Examiner—Kevin Quarterman
(74) Attorney, Agent, or Firm—Christie, Parker and Hale, LLP (57) ABSTRACT

Noise exiting from a plasma display device is effectively reduced and a degree of freedom of design is increased according to a plasma display device that includes a base chassis, a PDP adhered to the base chassis, a PDP driving circuit board adhered to the base chassis opposite to the PDP, a front cover disposed in front of the PDP, a rear cover having a plurality of ventilation holes for heat radiation, the rear cover being disposed at the rear of the base chassis and covering the base chassis, and a noise-shielding member for covering the plurality of ventilation holes from front or rear thereof, such that noise generated inside of the device is reflected or diffracted.

19 Claims, 7 Drawing Sheets

PLASMA DISPLAY DEVICE WITH REDUCED NOISE EXITING THROUGH HEAT RADIATION VENTILATION OPENINGS

CROSS REFERENCE TO RELATED APPLICATION

This application makes reference to, incorporates by reference the same herein, and claims priority to and all the benefits under 35 U.S.C. §119 from patent application entitled PLASMA DISPLAY DEVICE filed with the Korean Industrial Property Office on Mar. 27, 2002 and there duly assigned Ser. No. 2002-16813.

FIELD OF THE INVENTION

The present invention relates to a plasma display device, and more particularly, to a plasma display device that reduces noise exiting through heat radiation ventilation openings.

BACKGROUND OF THE INVENTION

A plasma display panel (PDP) is an element for realizing images by activating phosphor in a vacuum by ultraviolet rays of gas discharge. A plasma display device using such a PDP is in the spotlight as a thin next generation display device because it can enable high resolution and a wide display area.

Such a plasma display device includes a PDP, a base chassis disposed in parallel with the PDP, a heat conducting material disposed between and closely adhered to the PDP and the base chassis, and a driving circuit disposed to the base chassis at its side opposite to the PDP and connected to the PDP for the drive of the PDP. In addition, a front cover is adopted to cover the PDP, and a rear cover covers the driving circuit.

A plasma display device structured as such generates noise and heat when the driving circuit drives the PDP. The rear cover is provided with a plurality of ventilation holes for radiating the heat to outside of the device.

While the ventilation holes radiate the heat, they also enable noises to exit therefrom, for example, a noise generated at a driving circuit such as an X-board, a Y-board, and an SMPS, and a noise generated at the PDP.

As an example of an effort to solve such a problem, Korean Laid Open patent publication 2000-033625 discloses an active noise-annihilation apparatus that generates a noise-annihilation signal having the same amplitude as but with an inverse phase to the noise. However, according to such a scheme, a means for generating the noise-annihilation signal is required, which is complicated and therefore expensive, and accordingly the manufacturing cost of a plasma display panel increases.

In addition, variation of the ventilation holes is limited by regulations.

The ventilation holes are usually of the dimension of 3–5 mm in diameter such that a test pin with a diameter of 4 mm and a length of 10 cm should not contact a dangerous voltage (3 Vpeak) through the ventilation holes. The exemplary dimensions of the test pin are in accordance with the IEC60065 specification for a television, and they may have a diameter of 3 mm and a length of 1.5 cm according to the IEC60950 specification for a monitor.

Therefore, according to such regulations regarding safety, there is not much room for variation in the shape of the ventilation holes, and accordingly, only limited amount of noise reduction could be achieved by varying the shape of the ventilation holes.

SUMMARY OF THE INVENTION

Therefore, the motivation for the present invention is to provide, to a plasma display device, non-limiting advantages of efficient reduction of noise exiting through heat radiation ventilation holes, and more degrees of freedom in designing the shape of the ventilation holes.

An exemplary plasma display device useful with the present invention includes a base chassis; a PDP adhered to the base chassis; a PDP driving circuit board adhered to the base chassis opposite to the PDP; a front cover disposed in front of the PDP; a rear cover having a plurality of ventilation holes for heat radiation, the rear cover being disposed at the rear of the base chassis and covering the base chassis; and a noise-shielding member for covering the plurality of ventilation holes from either or both of the front and rear thereof, such that noise generated inside of the device is reflected or diffracted.

In a further embodiment, the noise-shielding member may be realized by a plurality of noise-shielding attachments formed integrally with the rear cover, or by a fixing plate connected to the rear cover and a plurality of noise-shielding attachments provided to the fixing plate.

The noise-shielding attachment preferably forms openings to the ventilation hole in at least one of a first (downward), a second (upward), and a third (leftward and/or rightward) directions.

A plasma display device structured as such shows a high heat radiation capacity and low noise leakage. In addition, it has a low manufacturing cost because the addition of such a noise-shielding member does not cost much.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

A preferred embodiment of the present invention will hereinafter be described in detail with reference to the accompanying drawings.

Figure 1:
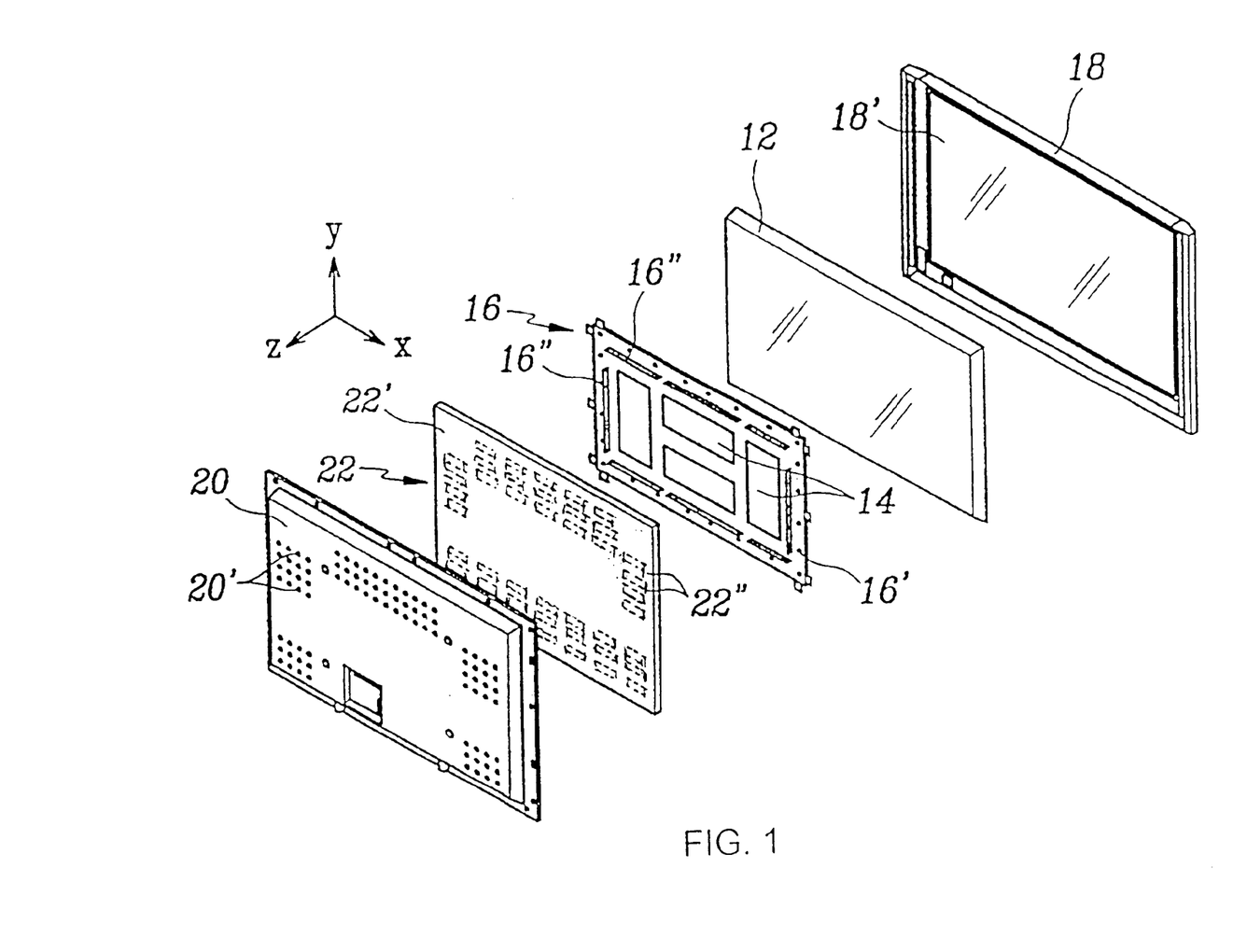
FIG. 1 is an exploded perspective view of a plasma display device according to a preferred embodiment of the present invention.

FIG. 1 is an exploded perspective view of a plasma display device according to a preferred embodiment of the present invention.

As shown in FIG. 1, a plasma display device according to a preferred embodiment of the present invention includes a plasma display panel (PDP) 12, a base chassis 16 for holding the PDP 12 and for installing driving circuit boards 14 thereon, a front cover 18 disposed in front of the PDP 12, a rear cover 20 covering the base chassis 16 and being disposed at the rear thereof, and a noise-shielding member 22 disposed between the base chassis 16 and the rear cover 20 and fixed to the rear cover 20.

The base chassis 16 is constructed of a pressed material. Many bosses 16' for installation of the circuit boards 14 are provided at a side of the base chassis 16 facing the rear cover 20. Ribs 16" in X- and/or Y-directions may be further provided to the base chassis for increasing strength thereof.

A conducting film layer 18' is attached to an inside of the front cover 18, i.e., to a side facing the PDP 12. The rear cover 20 together with the front cover 18, enclosing the PDP 12 and the base chassis 16, are assembled to the base chassis 16 such that they form an exterior of the plasma display device.

Meanwhile, the noise-shielding member 22 includes a fixing plate 22' fixed to the rear cover 20, for example by riveting or welding, and a plurality of noise-shielding attachments 22" are provided to the fixing plate 22'.

Figure 2A:
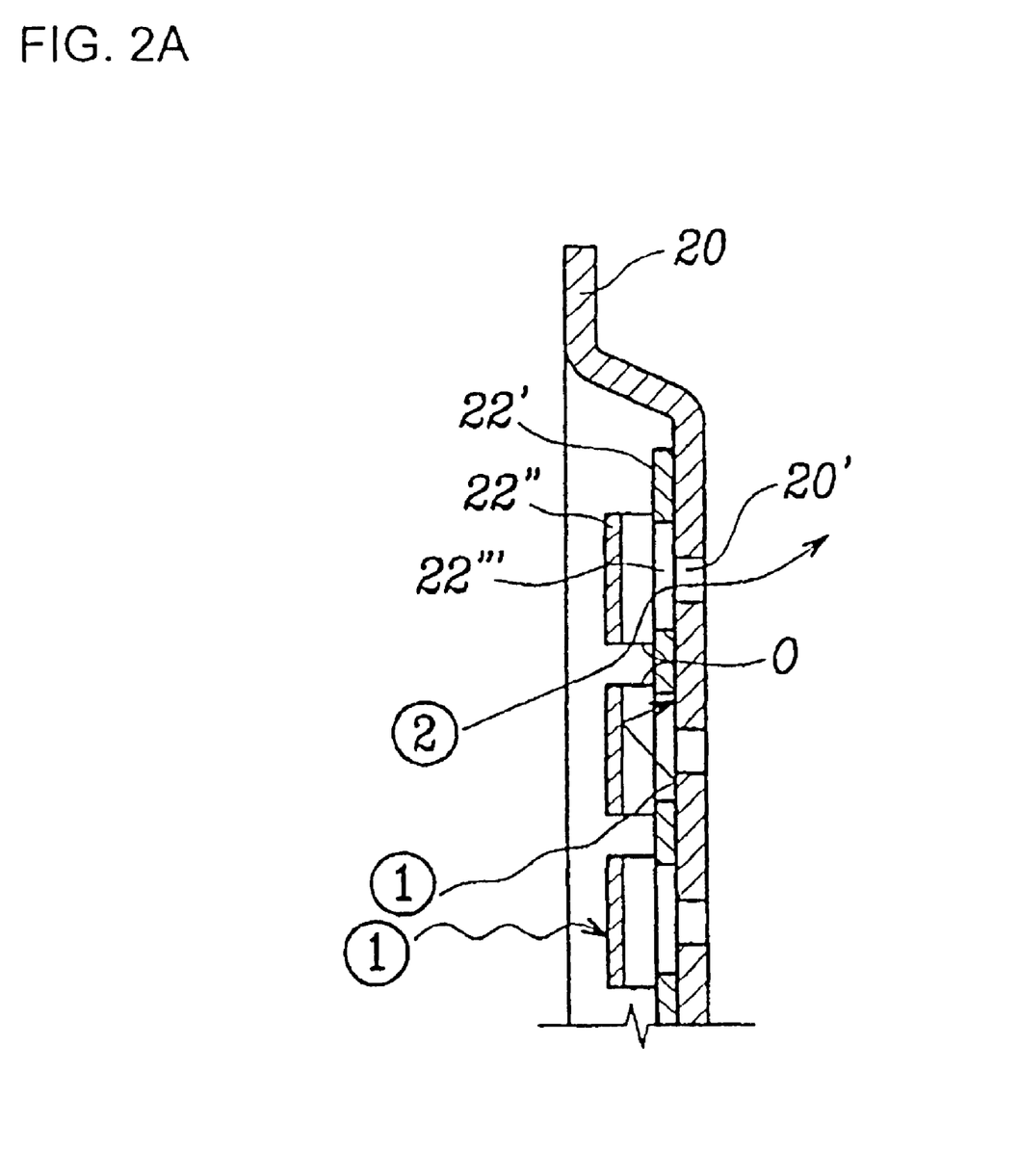
FIGS. 2A, 2B, and 2C are sectional views of a set of a rear cover and a noise-shielding member, showing variations in their interconnection relationship under the spirit of a first preferred embodiment of the present invention.

As shown in FIG. 2A, the noise-shielding attachments 22" are formed at positions corresponding to the ventilation holes 20' for radiating heat from inside of the device to the outside thereof. Each of the noise-shielding attachments 22" forms openings O to the corresponding ventilation hole 20' in a first (downward) and a second (upward) directions, and covers other sides of the ventilation hole 20'. The prescribed "other sides" denotes a third (leftward and/or rightward) direction and a fourth (front) direction.

The reference number 22''' designates a passage hole communicating with the ventilation hole 20', and the passage hole 22''' enables heated air inflowing to the passage hole 22''' to escape to the outside through the ventilation hole 20'.

Figure 2B:
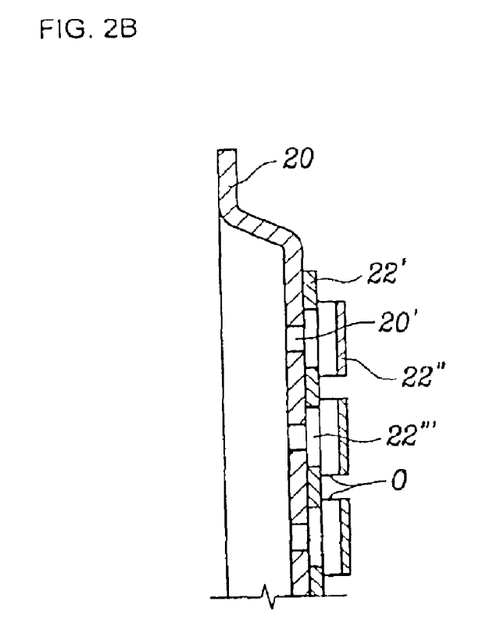
Figure 2C:
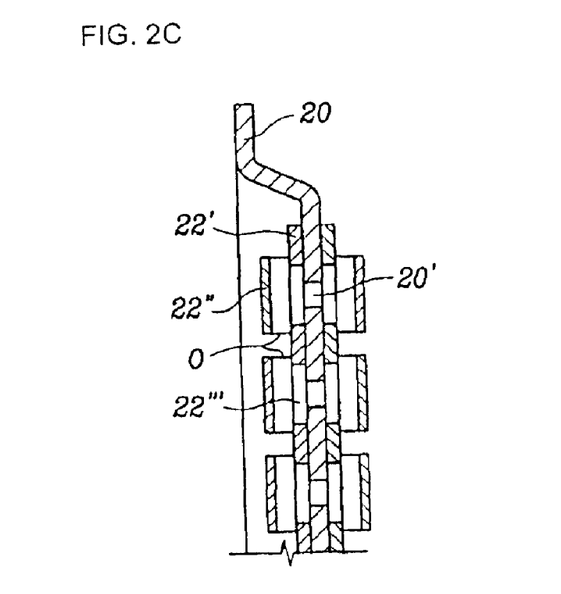

The noise-shielding member 22 may be arranged to the outside of the rear cover 20 as shown in FIG. 2B, or noise-shielding members 22 may be arranged to the inside and outside of the rear cover 20 as shown in FIG. 2C.

Figure 3A:
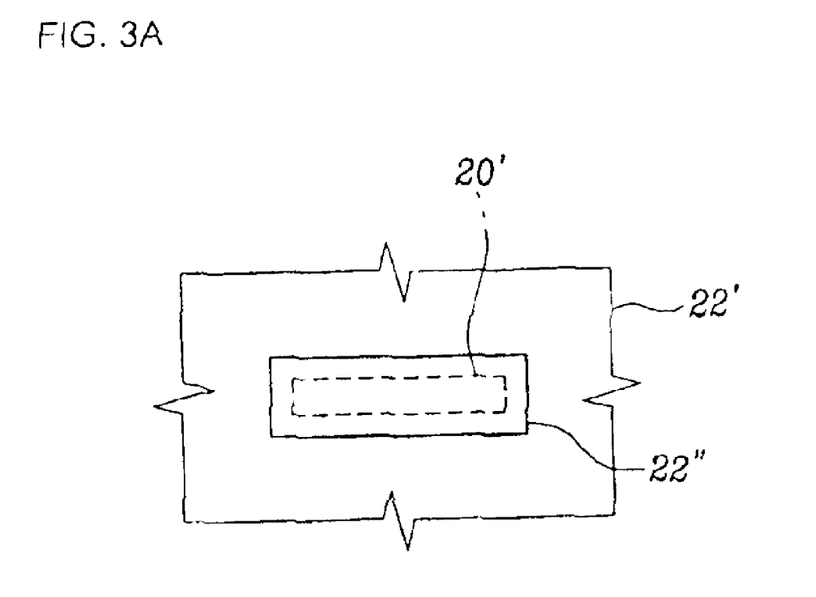
FIGS. 3A and 3B respectively illustrate a relationship between a noise-shielding attachment and a ventilation hole according to a first preferred embodiment of the present invention.

The noise-shielding member 22 structured as such prevents a test pin from reaching elements contained inside of the plasma display device because all sides except the openings O of the ventilation hole 20', i.e., the front, leftward, and rightward sides, are covered by the noise-shielding attachments 22". Therefore, the ventilation holes 20' may be more than 5 mm in diameter without causing a safety problem, and in addition, the shape of the ventilation holes 20' may be in a variety of forms. For example, the ventilation holes 20' may be in a form of a slit as shown in FIG. 3A, which increases efficiency of the rear cover 20.

Figure 3B:
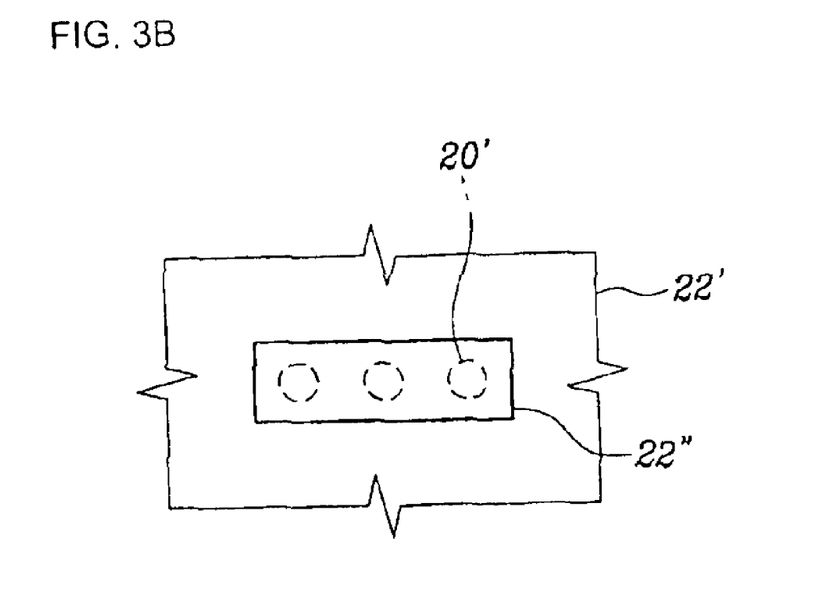

In addition, as shown in FIG. 3B, a plurality of ventilation holes 20' may be covered by one noise-shielding attachment 22".

According to the above described embodiment of the present invention having the noise-shielding member 22, noise generated at a noise source (e.g., a driving circuit such as an X-board, a Y-board, and a SMPS, or at a PDP) inside of the device is reflected or diffracted by the noise-shielding attachments 22" and the rear cover 20 as depicted by arrows ①, and accordingly is diminished and eliminated by the reflection and diffraction.

Meanwhile, heated air in the device escapes to the outside, consecutively through the openings O of the noise-shielding attachment 22", the passage hole 22''', and the ventilation hole 20', as depicted by an arrow ②.

Heat radiation efficiency of the noise-shielding member described above with reference to FIGS. 2A–2C is enhanced because the heated air inflowing through a lower opening may circulate inside of the device through an upper opening.

Figure 4A:
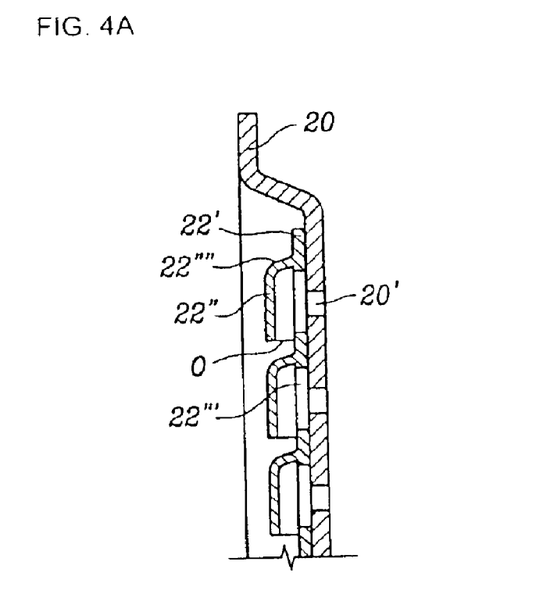
FIGS. 4A, 4B, and 4C are sectional views of a set of a rear cover and a noise-shielding member, showing variations in their interconnection relationship under the spirit of a second preferred embodiment of the present invention.

In this case, as shown in FIG. 4A, efficiency in heat radiation may be enhanced by altering the shape of the noise-shielding member 22 such that the noise-shielding attachment 22" closes the upper opening of the FIG. 2A by a guide 22"" and maintains the lower opening in an open state.

Figure 4B:
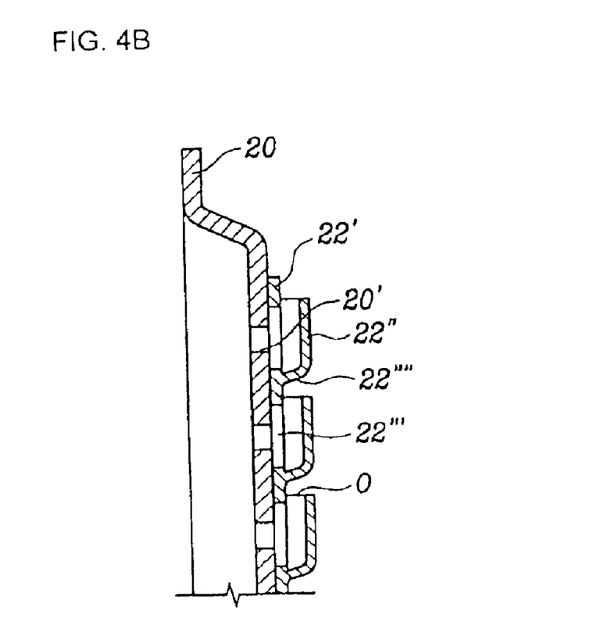
Figure 4C:
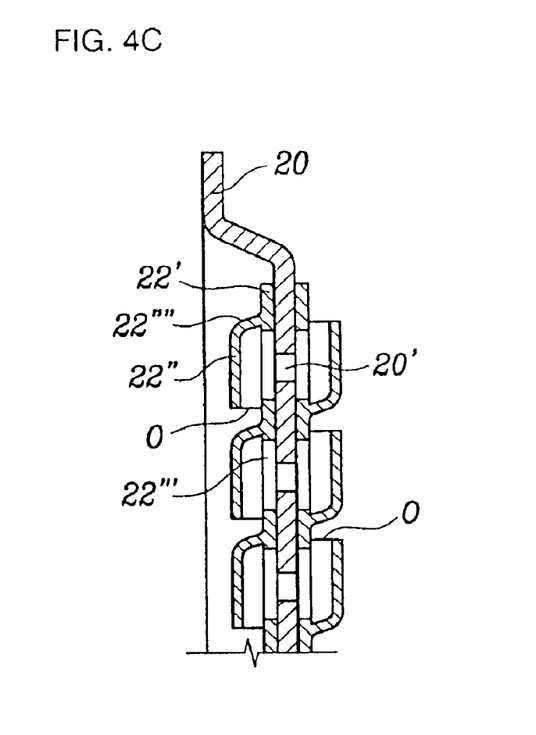

The noise-shielding attachment provided with the guide 22"" may be arranged at the inside or outside of the rear cover 20, as shown in FIGS. 4B and 4C.

When the noise-shielding member having the guide 22"" is arranged to outside of the rear cover 20, the guide 22"" preferably covers the lower opening of the ventilation hole 20'.

The noise-shielding member 22 structured as such shows enhanced efficiency in heat radiation because all the heated air that has flowed through the opening can be radiated since the noise-shielding attachments 22" covers all sides except the opening O of the ventilation hole 20'.

Figure 5:
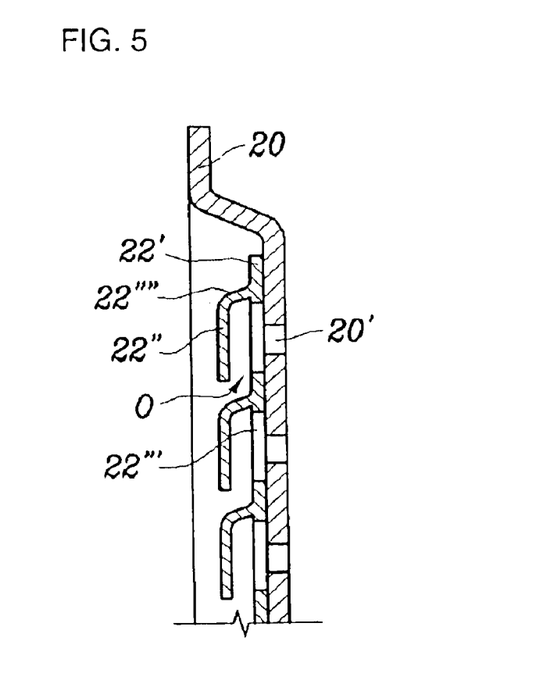
FIG. 5 is a sectional view of a set of a rear cover and a noise-shielding member according to a third preferred embodiment of the present invention.

FIG. 5 shows an embodiment of which a noise-shielding attachment is provided with openings to its leftward and/or rightward directions (i.e., the sides), the embodiment of FIG. 5 having the same effect as the embodiment of FIG. 4A.

Figure 6:
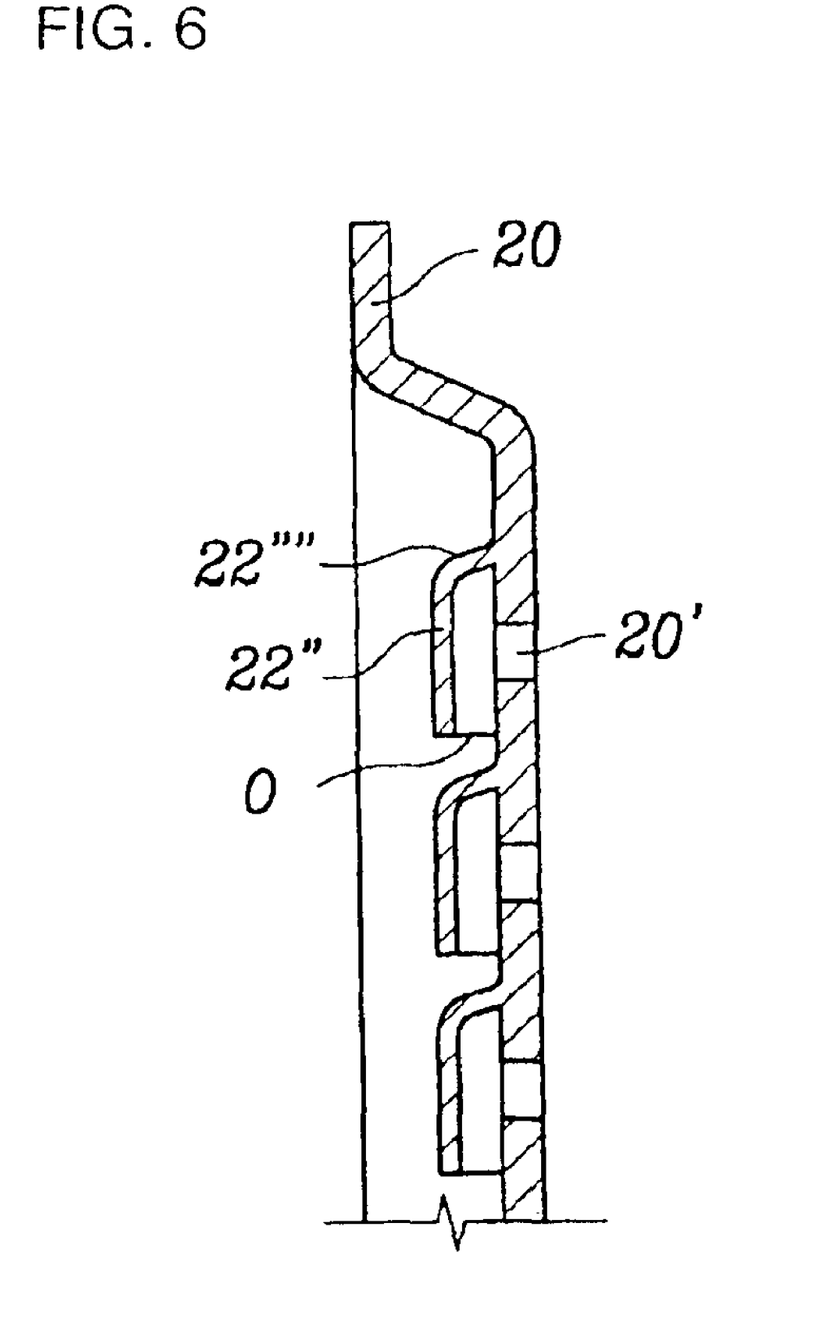
FIG. 6 is a sectional view of a set of a rear cover and a noise-shielding member according to a fourth preferred embodiment of the present invention.

It is also preferable that the present invention may have an embodiment as shown in FIG. 6. That is, noise-shielding attachments 22" having guides 22"" and forming openings O are formed integrally with the rear cover 20. Other detailed features of the embodiment shown in FIG. 6, e.g., shapes and positions of the attachments 22", are the same as or varied obviously from the above described embodiments, especially with reference to FIGS. 2A–2C and/or FIGS. 4B and 4C.

As described above, according to a preferred embodiment of the present invention, noise that exits from a plasma display device is reduced by diminishing the noise inside of the device, while maintaining its heat-radiating efficiency. A degree of freedom in designing a rear cover may be enhanced because a test pin is prevented from reaching elements contained inside of the device. That is, ventilation holes may be enlarged from the diameter of 3~5 mm of the prior art. In addition, they may also have a variety of forms, which increases its efficiency. Furthermore, an increase in production cost caused by alterations according to the preferred embodiment is very small.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A plasma display device comprising:

a base chassis;

a PDP adhered to the base chassis;

a PDP driving circuit board adhered to the base chassis opposite to the PDP;

a front cover disposed in front of the PDP;

a rear cover having a plurality of ventilation holes for heat radiation, the rear cover being disposed at the rear of the base chassis and covering the base chassis; and a noise-shielding member covering the plurality of ventilation holes from either or both of the front and rear thereof.

2. The plasma display device of claim 1, wherein the noise-shielding member comprises:

at least one fixing plates connected to the rear cover, the at least one fixing plate having a plurality of passages communicating with respective ventilation holes; and a plurality of noise-shielding attachments connected to the fixing plate over the respective passages and forming heated air guidepaths from within the plasma display device to a respective ventilation hole.

3. The plasma display device of claim 2, wherein the noise-shielding attachment forms openings to the ventilation hole in at least one of a first direction, a second direction, and a third direction.

4. The plasma display device of claim 3, wherein the noise-shielding attachment includes openings to the ventilation hole in the first direction and the second direction.

5. The plasma display device of claim 4, wherein the ventilation hole is of a circular shape.

6. The plasma display device of claim 4, wherein the ventilation hole is in a form of a slit.

7. The plasma display device of claim 3, wherein the fixing plate is connected to the rear cover from inside of the rear cover, and the noise-shielding attachment is connected with the fixing plate over the ventilation hole and forms a heated air guidepath from an opening of the first direction to the ventilation hole.

8. The plasma display device of claim 3, wherein the fixing plate is connected to the rear cover from outside of the rear cover, and the noise-shielding attachment is connected with fixing plate over the ventilation hole and forms a heated air guidepath from the ventilation hole to an opening of the second direction.

9. The plasma display device of claim 3, wherein:

the fixing plates are connected to the rear cover from both of inside and outside of the rear cover;

the noise-shielding attachment of the fixing plate inside of the rear cover is connected to the fixing plate over the ventilation hole and forms a heated air guidepath from an opening of the first direction to the ventilation hole; and the noise-shielding attachment of the fixing plate outside of the rear cover is connected to the fixing plate over the ventilation hole and forms a heated air guidepath from the ventilation hole to an opening of the second direction.

10. The plasma display device of claim 3, wherein the ventilation hole is of a circular shape.

11. The plasma display device of claim 3, wherein the ventilation hole is in a form of a slit.

12. The plasma display device of claim 1, wherein the noise-shielding member comprises a plurality of noise-shielding attachments formed integrally with the rear cover.

13. The plasma display device of claim 12, wherein the noise-shielding attachment forms openings to the ventilation hole in at least one of a first direction, a second direction, and a third direction.

14. The plasma display device of claim 13, wherein the noise-shielding attachment forms openings to the ventilation hole in both the first direction and the second direction.

15. The plasma display device of claim 13, wherein the noise-shielding attachments are connected to the rear cover from inside of the rear cover over respective ventilation holes and form a respective heated air guidepath from a respective opening of the first direction to the respective ventilation hole.

16. The plasma display device of claim 13, wherein the noise-shielding attachments are connected to the rear cover from outside of the rear cover over respective ventilation holes and form a respective heated air guidepath from the respective ventilation hole to a respective opening of the second direction.

17. The plasma display device of claim 13, wherein:

the noise-shielding attachments are connected to the rear cover from both of inside and outside of the rear cover;

the noise-shielding attachments are connected to the rear cover from inside of the rear cover over respective ventilation holes and form a heated air guidepath from a respective opening of the first direction to the respective ventilation hole; and the noise-shielding attachments are connected to the rear cover from outside of the rear cover over respective ventilation holes and form a heated air guidepath from the respective ventilation hole to an opening of the second direction.

18. The plasma display device of claim 13, wherein the ventilation hole is of a circular shape.

19. The plasma display device of claim 13, wherein the ventilation hole is in a form of a slit.

* * * * *